(12) United States Patent
Hung

(10) Patent No.: US 8,976,604 B2
(45) Date of Patent: Mar. 10, 2015

(54) METHOD AND APPARATUS FOR COPYING DATA WITH A MEMORY ARRAY HAVING REDUNDANT MEMORY

(75) Inventor: Shuo-Nan Hung, Jhubei (TW)

(73) Assignee: Macronix International Co., Lt., Hsinchu (TW)

( * ) Notice: Subject to any disclaimer, the term of this patent is extended or adjusted under 35 U.S.C. 154(b) by 270 days.

(21) Appl. No.: 13/372,193

(22) Filed: Feb. 13, 2012

(65) Prior Publication Data

US 2013/0208548 A1 Aug. 15, 2013

(51) Int. Cl.
*G11C 19/08* (2006.01)

(52) U.S. Cl.
USPC .. 365/189.05; 365/200; 365/227; 365/230.03

(58) Field of Classification Search
USPC ........................ 365/189.05, 200, 227, 230.03
See application file for complete search history.

(56) References Cited

U.S. PATENT DOCUMENTS

| | | |
|---|---|---|
| 5,077,691 A | 12/1991 | Haddad et al. |
| 5,126,973 A | 6/1992 | Gallia et al. |
| 5,325,334 A | 6/1994 | Roh et al. |
| 5,537,665 A | 7/1996 | Patel et al. |
| 5,590,085 A | 12/1996 | Yuh et al. |
| 5,621,691 A | 4/1997 | Park |
| 5,732,030 A | 3/1998 | Dorney |
| 5,812,466 A | 9/1998 | Lee et al. |
| 5,953,270 A | 9/1999 | Kim |
| 5,959,904 A | 9/1999 | Oh |
| 5,999,463 A | 12/1999 | Park et al. |
| 6,002,620 A | 12/1999 | Tran et al. |
| 6,094,384 A | 7/2000 | Ka |
| 6,115,300 A | 9/2000 | Massoumi et al. |
| 6,141,268 A | 10/2000 | Chen et al. |
| 6,205,515 B1 | 3/2001 | Huang |
| 6,317,355 B1 | 11/2001 | Kang |
| 6,337,816 B1 | 1/2002 | Park et al. |
| 6,343,037 B1 | 1/2002 | Park et al. |
| 6,445,626 B1 | 9/2002 | Hsu et al. |
| 6,490,208 B2 | 12/2002 | Yoon |
| 6,496,425 B1 | 12/2002 | Abedifard et al. |
| 6,603,690 B1 | 8/2003 | Chen et al. |
| 6,665,221 B2 | 12/2003 | Abedifard et al. |
| 6,671,214 B2 | 12/2003 | Abedifard et al. |
| 6,674,676 B1 | 1/2004 | Hsu et al. |
| 6,678,195 B2 * | 1/2004 | Hidaka ..................... 365/200 |
| 6,915,467 B2 | 7/2005 | Pilo |
| 6,966,012 B1 | 11/2005 | Gandhi |
| 7,064,990 B1 | 6/2006 | Dawson et al. |
| 7,134,057 B1 | 11/2006 | Kaushik et al. |
| 7,251,173 B2 | 7/2007 | Lunde et al. |
| 7,570,536 B2 | 8/2009 | Chi |
| 7,738,308 B2 | 6/2010 | Afghahi et al. |
| 2002/0196677 A1 * | 12/2002 | Braceras et al. .......... 365/200 |
| 2004/0123181 A1 | 6/2004 | Moon et al. |

(Continued)

*Primary Examiner* — Richard Elms
*Assistant Examiner* — Mohammed A Bashar
(74) *Attorney, Agent, or Firm* — Kenta Suzue; Haynes Beffel & Wolfeld LLP

(57) ABSTRACT

A page copy operation such as copy back programming is performed between a source page of the memory array and a destination page of the memory array in different segments. The segments divide the columns of the main array and the set of redundant columns of the redundant array into, for example, sets of rows. The copy back programming transfers data from a part of the source page in the redundant array to a part of the destination page in the main array, and transfers data from a part of the source page in the main array to a part of the destination page in the redundant array.

25 Claims, 13 Drawing Sheets

(56) References Cited

U.S. PATENT DOCUMENTS

| | | | |
|---|---|---|---|
| 2006/0291303 A1* | 12/2006 | Kleveland et al. | 365/200 |
| 2008/0229000 A1* | 9/2008 | Kim | 711/103 |
| 2009/0180340 A1 | 7/2009 | Song et al. | |
| 2010/0107004 A1 | 4/2010 | Bottelli et al. | |
| 2012/0075943 A1 | 3/2012 | Chen et al. | |

* cited by examiner

Copy from source page to page buffer

Adjust data in page buffer

Transfer from page buffer to destination page

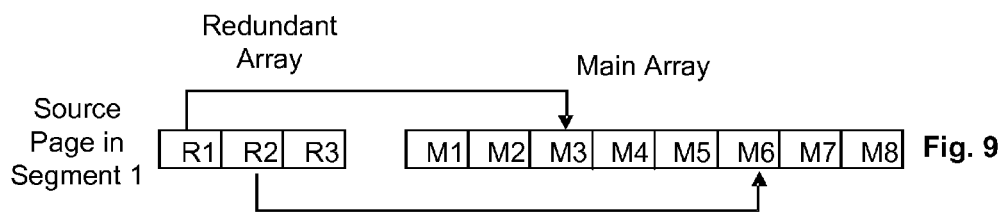
Fig. 8
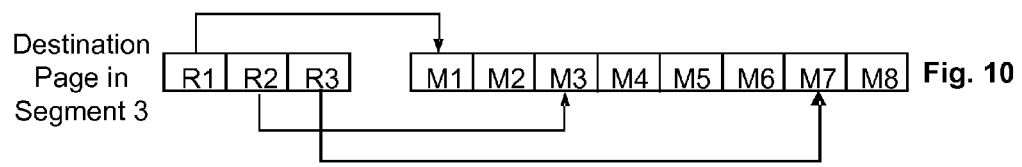
Fig. 9
Fig. 10

| Sequence\\Signal | Step 1 | | Step 2 | | | Step 3 | | |
| --- | --- | --- | --- | --- | --- | --- | --- | --- |
| | Load 1 | Load 2 | Write 1 | Write 2 | Read 1 | Read 2 | Read 3 | Write 3 |
| YRED1 | 1 | 0 | 0 | 0 | 0 | 0 | 0 | 0 |
| YRED2 | 0 | 1 | 1 | 0 | 0 | 0 | 0 | 0 |
| YRED3 | 0 | 0 | 0 | 0 | 0 | 0 | 0 | 1 |
| YDISABLE | 1 | 1 | 1 | 1 | 0 | 0 | 0 | 1 |
| YADDR | X | X | X | X | X | X | X | X |
| YADDR_PB | X | X | M3 | M6 | M1 | M3 | M7 | M7 |
| Ymn | 0 | 0 | 0 | M6 | M1 | M3 | M7 | 0 |
| MUX for YREDx | SEG1 | SEG1 | SEG3 | SEG3 | SEG3 | SEG3 | SEG3 | SEG3 |
| MUX for YADDR_PB | X | X | SEG1 | SEG1 | SEG3 | SEG3 | SEG3 | SEG3 |

Fig. 11

| Sequence | Step 1 | | Step 2 | | | | | | Step 3 | |
|---|---|---|---|---|---|---|---|---|---|---|
| Signal | Load 1 | Load 2 | Read 1 | Write 1 | Read 2 | Write 2 | Read 3 | Write 3 | Write 1 | Write 2 |
| YRED1 | 1 | 0 | 0 | 1 | 0 | 0 | 0 | 0 | 0 | 0 |
| YRED2 | 0 | 1 | 0 | 0 | 0 | 1 | 0 | 0 | 1 | 0 |
| YRED3 | 0 | 0 | 0 | 0 | 0 | 0 | 0 | 1 | 0 | 0 |
| YDISABLE | 1 | 1 | 0 | 1 | 0 | 1 | 0 | 1 | 1 | 0 |
| YADD | X | X | X | X | X | X | X | X | X | X |
| YADD_PB | X | X | M1 | M1 | M3 | M3 | M7 | M7 | M3 | M6 |
| Ymn | 0 | 0 | M1 | 0 | M3 | 0 | M7 | 0 | 0 | M6 |
| MUX for YREDx | SEG1 | SEG1 | SEG3 | SEG3 | SEG3 | SEG3 | SEG3 | SEG3 | SEG3 | SEG3 |
| MUX for YADD_PB | X | X | SEG3 | SEG3 | SEG3 | SEG3 | SEG3 | SEG3 | SEG1 | SEG1 |

Fig. 17

METHOD AND APPARATUS FOR COPYING DATA WITH A MEMORY ARRAY HAVING REDUNDANT MEMORY

BACKGROUND

1. Field of the Invention

This technology relates to copying data stored in a memory array with a redundant memory area.

2. Description of Related Art

A memory page copy operation, such as the copy back programming command, copies memory from a source page to a destination page, without transferring the copied data to and from a buffer memory external to the integrated circuit. Instead, the copy operation transfers the copied data from the source page to an internal page buffer, and then from the internal page buffer to the destination page.

In prior art, for the redundancy memory scheme (shown in FIG. 1), the defective column is repaired by a redundant column. The copy back program scheme for the prior memory scheme is quite simple, and is shown in FIG. 2. In the copy back program flow, in step 1 the copy back read command is issued. In step 2, the data for the source page is downloaded from the array to the internal page buffer. Step 3 the copy back program command is issued, which includes input of the destination page address. Step 4 is optional; the internal page buffer data also can be modified or added from the external source if needed. In step 5, the copy back program start command is issued. For the final step, the internal page buffer data is directly programmed to the destination page.

In this prior art, the memory operations that address defective memory locations are redirected by column redundancy circuitry to the redundant memory locations assigned to the defective memory locations of the main array. Accordingly, such memory operations that address defective memory locations are performed instead on the redundant memory locations.

However, in a defective column, the defect may happen in the whole column or part of the column. In the general case, the majority of defects happen in only part of the column, and it is more economical to divide one redundant column into several repair segments, as shown in FIG. 3, which has two redundancy segments Segment 1 and Segment 2. In another example in FIG. 8, the redundancy segments Segment 1, Segment 2, Segment 3, Segment 4 divide both the main array and the redundant array. The first redundant column segment can be used to repair the first defective column segment, that is, from block 0 to block 255. The second redundant column segment can be used to repair the second defective column segment (block 256 to block 511), and so on. The presently described technology is used in this latter case of one redundant column divided into several repair segments.

For the multi-segment redundant system, the copy back program scheme of the prior art cannot be used. A memory page copy operation such as copy back programming bypasses the column redundancy circuitry, and as a result, bypasses the associated redirection of defective memory addresses to redundant memory addresses. If a particular column of the memory array is defective at the source page, then copying data from that defective column of the source page is ineffective. Similarly, if a particular column of the memory array is defective at the destination page, then copying data to that defective column of the destination page is ineffective.

Because the memory page copy operation fails to include the redirection of defective addresses in the main array to replacement addresses in the redundant array, the memory page copy operation from the source page to the destination page results in various failures.

In one case, the source page may have a defect in a particular main address of the main array part of the source page, for example at a particular column of the main array part of the source page. However, the destination page may not have a defect in the same particular main address of the main array part of the destination page, for example the same particular column of the main array part of the destination page.

In another case, the destination page may have a defect in a particular main address of the main array part of the destination page, for example at a particular column of the main array part of the destination page; whereas the source page may not have a defect in the same particular main address of the main array part of the source page, for example the same particular column of the main array part of the source page.

In yet another case, the source page and the destination page may have a defect in a same particular main address of the main array parts of the source page and the destination page, for example at a same particular column of the main array parts of the source page and the destination page. However, the defects may be fixed by different parts of the respective redundant array at different redundant addresses. For example the defect in the main array part of the source page may be fixed by a first particular column of the redundant array part of the source page, whereas the defect in the main array part of the destination page may be fixed by a second particular column of the redundant array part of the destination page.

In another prior art for the multi-segments redundant system, the page buffer is required to be non-defective memory. In this memory, the external data in and out is moved through the page buffer of the main array. In the read procedure, the page buffer data is moved from the redundant column to the defective column at the end of the read procedure. In the program procedure (including the copy back program), the page buffer data is moved from the defective column to the redundant column at the beginning of the program procedure. The scheme is quite simple. However, some penalty is paid for the non-defective page buffer. For example, a larger page buffer area can be used to relax the critical design rule.

To address various problems with the prior art, for the multi-segments redundant system, a new copy back program scheme is proposed in the following description.

SUMMARY

One aspect the technology is a memory device with a memory array and control circuitry.

The memory array is arranged into a main array divided into a plurality of segments, and a redundant array divided into the plurality of segments corresponding to the main array.

A set of defective positions in a particular segment of the main array is replaced by redundant memory in a corresponding particular segment of the redundant array.

For example, the main array is arranged into rows and columns. The redundant array includes a set of redundant columns. The segments divide the columns of the main array and the set of redundant columns of the redundant array into sets of rows. A set of defective positions in a particular set of rows of the main array are replaced by redundant memory in the particular set of rows of the redundant columns. In one embodiment, because a redundant column is divided into multiple segments, the redundant column can be assigned to repair defects in different columns of the main array, so long as the defects appear in different segments.

The control circuitry supports a page copy operation, such as copy back programming, between a source page of the memory array and a destination page of the memory array in different segments of the plurality of segments. In one embodiment, the copy back programming copies data from the source page of the memory array to the destination page of the memory array without transporting the data in and out of the memory device. In another embodiment, the copy back programming copies data from the source page of the memory array to the destination page of the memory array and performs at least one of: transferring data out of the memory device (such as for error correction or for another purpose) and transferring data into the memory device (such as for error correction, data appending, or for another purpose).

The page copy operation transfers data from a part of the source page in the redundant array to a part of the destination page in the main array, and/or transfers data from a part of the source page in the main array to a part of the destination page in the redundant array. Transferring data from a part of the source page in the redundant array to a part of the destination page in the main array accounts for the source page redundancy assignment of redundant memory to defects in the source page. Transferring data from a part of the source page in the main array to a part of the destination page in the redundant array accounts for the destination page redundancy assignment of redundant memory to defects in the destination page.

Various embodiments further comprise a page buffer including a main page buffer corresponding to the main array and a redundant page buffer corresponding to the redundant array. For example, a memory page having particular sizes in the main array and the redundant array can be stored by the page buffer having adequate sizes of the main page buffer and the redundant page buffer.

In one embodiment, the control circuitry supports the page copy operation, with one or more changes to data in the page buffer having a copy of the source page.

The control circuitry supports the page copy operation, with one or more changes to data in the page buffer having a copy of the source page that account for the source page redundancy assignment and for the destination page redundancy assignment. Such changes to the data in the page buffer are discussed throughout this paper.

Various embodiments include a source page redundancy assignment and a destination page redundancy assignment that fix defects in respectively the source page and the destination page. The source page redundancy assignment replaces the set of defective positions in the main array of the source page with particular parts of the redundant memory of the corresponding segment of the source page. The destination page redundancy assignment replaces the set of defective positions in main array of the destination page with particular parts of the redundant memory of the destination page.

Various embodiments include the page buffer as described and temporary registers corresponding to the redundant page buffer. The temporary registers provide additional memory locations which assist during the control circuitry operations.

Various embodiments have a multi-part source page, multi-part destination page, a main addressing scheme, and a redundant addressing scheme.

The source page has parts including a main source page in the main array and a redundant source page in the redundant array. Defects in the main source page in the main array are repaired by the redundant source page in the redundant array.

The destination page has parts including a main destination page in the main array and a redundant destination page in the redundant array. Defects in the main source page in the main array are repaired by the redundant source page in the redundant array.

The main addressing scheme is shared by the main source page, the main destination page, and the main page buffer, such that a main address of the main addressing scheme identifies corresponding parts of the main source page, the main destination page, and the main page buffer. For example, the main source page, the main destination page, and the main page buffer can all have N address locations, such as N columns, bytes, bits, or other memory unit. Then a main address i between 1 and N can identify corresponding parts of the main source page in the main array, the main destination page in the main array, and the main page buffer. During the page copy operation, data at main address i of the main source page is copied to main address i of the main page buffer and to main address i of the main destination page, with modifications described herein.

The redundant addressing scheme is shared by the redundant source page, the redundant destination page, the redundant page buffer, and the temporary registers, such that a redundant address of the redundant addressing scheme identifies corresponding parts of the redundant source page, the redundant destination page, the redundant page buffer, and the temporary registers. For example, the redundant source page, the redundant destination page, the redundant page buffer, and the temporary registers, can all have M address locations, such as M columns, bytes, bits, or other memory unit. Then a redundant address j between 1 and M can identify corresponding parts of the redundant source page in the redundant array, the redundant destination page in the redundant array, the redundant page buffer, and the temporary registers. During the page copy operation, data at main address j of the redundant source page is copied to redundant address j of the redundant page buffer, redundant address j of the temporary registers, and to redundant address j of the redundant destination page, with modifications described herein.

The source page redundancy assignment replaces the set of defective positions in the main source page with particular parts of the redundant source page, by assigning one or more redundant addresses of the redundant source page to replace one or more main addresses of the set of defective positions in the main source page, The destination page redundancy assignment replaces the set of defective positions in the main destination page with particular parts of the redundant destination page, by assigning one or more redundant addresses of the redundant destination page to replace one or more main addresses of the set of defective positions in the main destination page.

In some embodiments, the main address is identical for parts of the main array in a same column of the memory array, and the redundant address is identical for parts of the redundant array in a same column of the redundant array.

In various embodiments, the control circuitry performs various acts in addition to copying the source page into the page buffer and the temporary registers, such that the main source page is copied to the main page buffer and the redundant source page is copied to the redundant page buffer and the temporary registers.

In one embodiment, the control circuitry transfers data from at least one particular redundant address of the temporary registers to at least one particular main address of the main page buffer. The source page redundancy assignment repaired the at least one particular main address of the main source page with the at least one particular redundant address of the redundant source page.

In one embodiment, the control circuitry transfers data from at least one particular main address of the main page buffer to at least one particular redundant address of the redundant page buffer, wherein the destination page redundancy assignment repaired the at least one particular main address of the main destination page with the at least one particular redundant address of the redundant destination page. One embodiment combines two data transfers described above. Another embodiment combines the two data transfers in a different order.

Another embodiment adjusts the data transfers, if the source page redundancy assignment and the destination page redundancy assignment repair the same main address in the source page and the destination page. The control circuitry, responsive to the source page redundancy assignment and the destination page redundancy assignment repairing the same main address of the main source page and the main destination page, transfers data from a first redundant address of the temporary registers to a second redundant address of the redundant page buffer. The source page redundancy assignment repaired the same main address of the main source page with the first redundant address of the redundant source page, and the destination page redundancy assignment repaired the same main address of the main destination page with the second redundant address of the redundant destination page.

A further embodiment omits part of a data transfer which has already occurred as described in the prior embodiment. The control circuitry, transfers data from at least one particular main address of the main page buffer to at least one particular redundant address of the redundant page buffer, except for cases where the at least one particular main address includes the same main address. As stated, such cases have already been satisfied in a prior data transfer. The destination page redundancy assignment repaired the at least one particular main address of the main destination page with the at least one particular redundant address of the redundant destination page.

Another aspect of the technology is a method of operating memory, comprising:

performing a page copy operation between a source page of a memory array and a destination page of the memory array in different segments of a plurality of segments dividing the memory array, the page copy operation including a transfer operation that transfers data from a part of the source page in the redundant array to a part of the destination page in the main array, and/or transfers data from a part of the source page in the main array to a part of the destination page in the redundant array. The transfer operation precedes a phase of copying data from a page buffer to the destination page.

Various embodiments are described herein.

BRIEF DESCRIPTION OF THE DRAWINGS

FIG. 8 shows a memory array divided into multiple redundancy segments, where defects of the main array in a particular redundancy segment are repaired by the redundant array in the same redundancy segment.

FIG. 9 shows a source page redundancy assignment within a particular redundancy segment, where particular parts of the source page in the redundant memory array are assigned to repair particular parts of the source page in the main array that have one or more defects.

FIG. 10 shows a destination page redundancy assignment within a particular redundancy segment, where particular parts of the destination page in the redundant memory array are assigned to repair particular parts of the destination page in the main array that have one or more defects.

FIG. 11 shows a table of signal values for different steps and different phases in the different steps, of a copy back programming operation.

FIG. 17 shows a table of signal values for different steps and different phases in the different steps, of a copy back programming operation, where the steps are in a different order than the table of FIG. 11.

DETAILED DESCRIPTION

Figure 2:
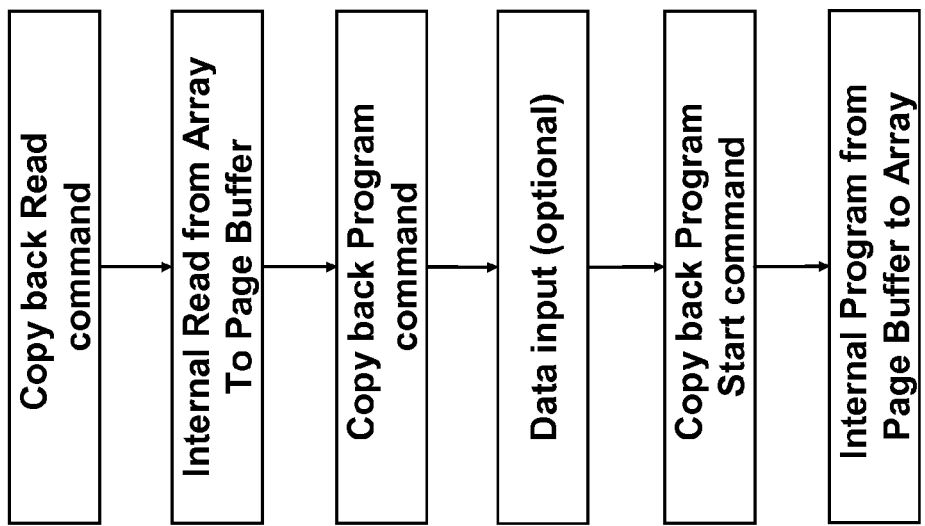
FIG. 2 is a flowchart of a copy back programming operation.
Figure 1:
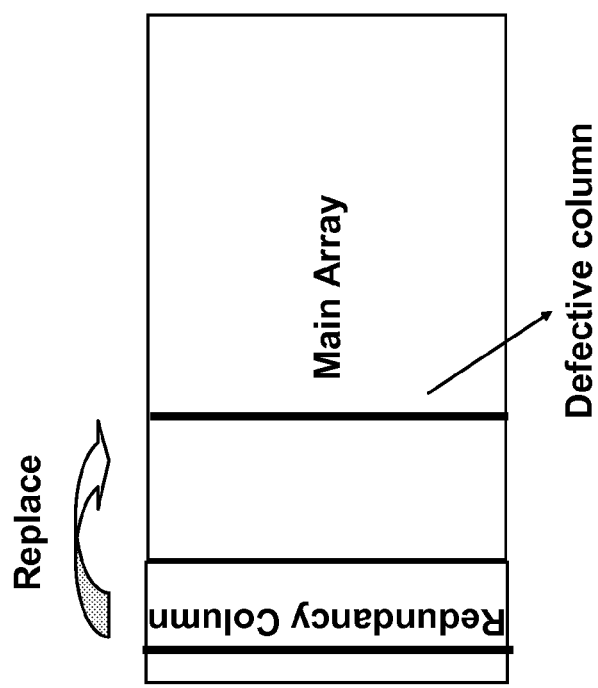
FIG. 1 shows a redundant column repairing an entire defective column.
Figure 4:
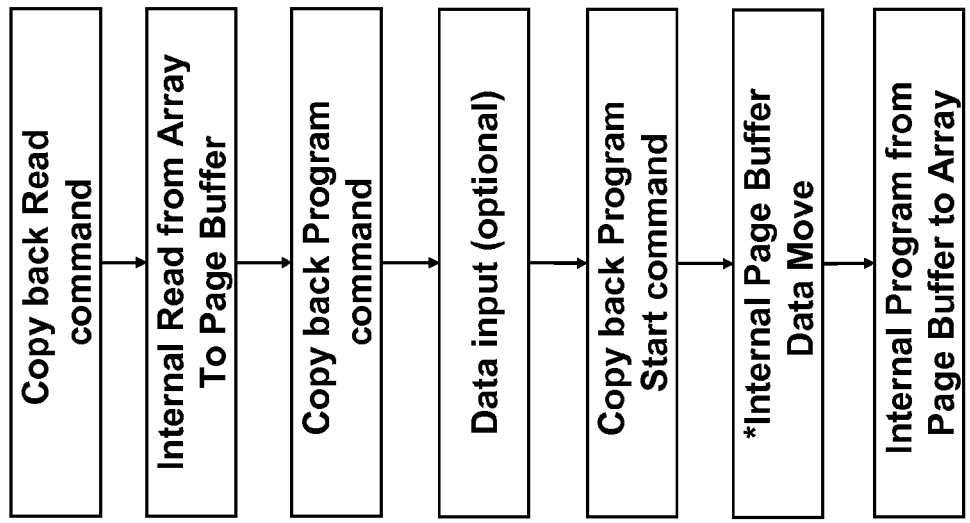
FIG. 4 is a flowchart of a copy back programming operation with an internal data move operation.
Figure 3:
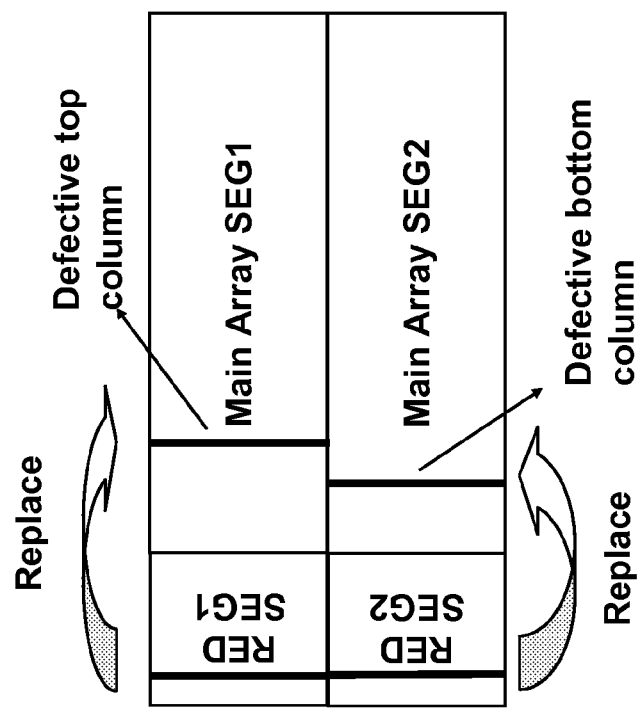
FIG. 3 shows a redundant column divided into multiple repair segments.

For the multi-segments redundant system, a new copy back program scheme is proposed in FIG. 4. In this new scheme, an extra step is added between step 5 and the final step. In this extra step, the page buffer data is changed from the source page repair base to the destination repair base.

FIG. 4 is a flowchart of a copy back programming operation. For example, in NAND flash, the copy back programming operation directly copies one page to another page without reading out the data from the integrated circuit.

First, a copy back Read command is received. The Data in the source page are transferred from the array to the page buffer. In one example, no data is read out after the internal procedure is finished. In some embodiments, the data can be read out and adjusted if necessary later. The source page is in a first redundancy segment. Defects in the main memory of a particular redundancy segment are fixed by the redundant memory of the same redundancy segment Next, the copy back programming command sequence is issued. In the copy back command sequence, copy back command is issued first, followed by address input. After that, data can be issued if necessary. The data may be error correction to the source page or new data appended to the source page. In the data input phase, the page buffer data structure still follows the first redundant segment assignment. Next, the copy back program command is issued to start the program operation.

Next, data in the page buffer is adjusted to account for the source page redundancy assignment and the destination page redundancy assignment. Various problems are addressed by such accounting. For example, the positions of any defects in the source page may or may not be the same as the positions of any defects in the destination page. In another example, even if positions of any defects in the source page are the same as positions of any defects in the destination page, the positions of the redundant memory which fix such defects may or may not be the same between the source page and the destination page.

Next, page buffer internal to the memory device is copied to the destination page. The destination page is in a second redundancy segment. Because the source page and the destination page are in different redundancy segments, the assignments from the redundant array to the main array can differ. For example, in the first redundancy segment, a particular column of the redundant array fixes one or more defects in a particular column of the main array, but in the second redundancy segment, a different particular column of the redundant array can fix one or more defects in the same particular column of the main array. In another example, in the second redundancy segment, the same particular column of the redundant array can fix one or more defects in a different column of the main array. In a further example, the in the second redundancy segment, the same particular column of the redundant array may not be assigned to fix any defects, or the same particular column of the main array may not have any defects. The prior step of adjusting the page buffer accounted for such outcomes.

Finally, the copy back programming is completed.

Figure 5:
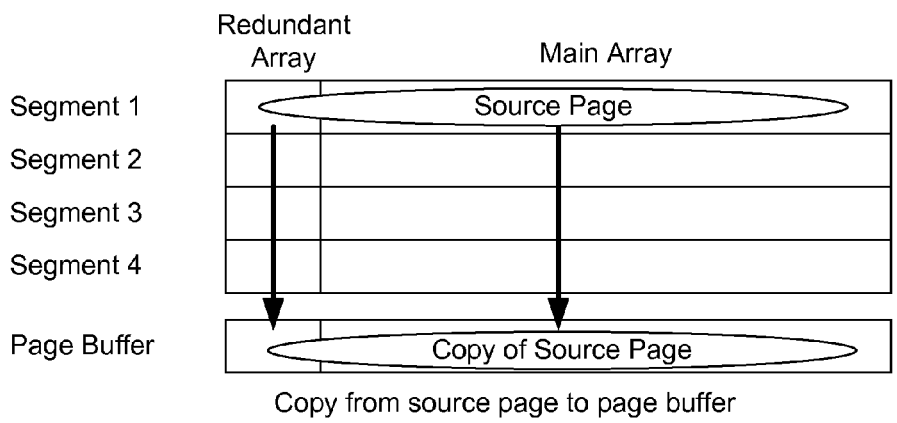
FIGS. 5-7 are diagrams of a memory array and a page buffer, showing steps in the copy back programming operation, where the memory array includes a main memory array and a redundant memory array, and the page buffer includes a main page buffer and a redundant page buffer.
Figure 6:
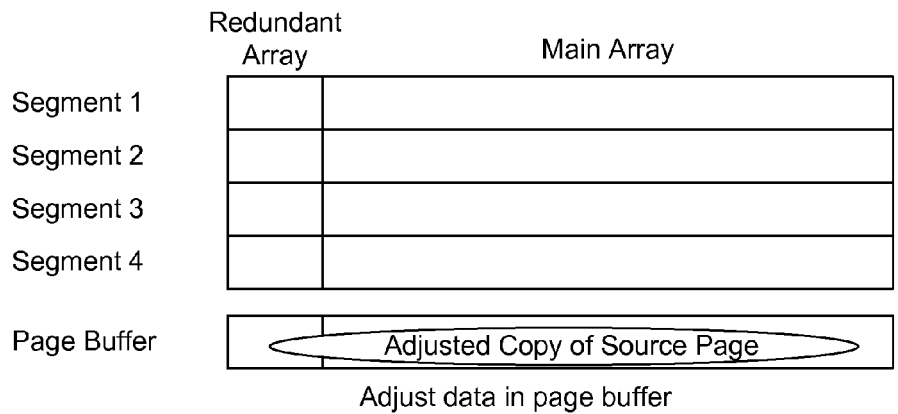
Figure 7:
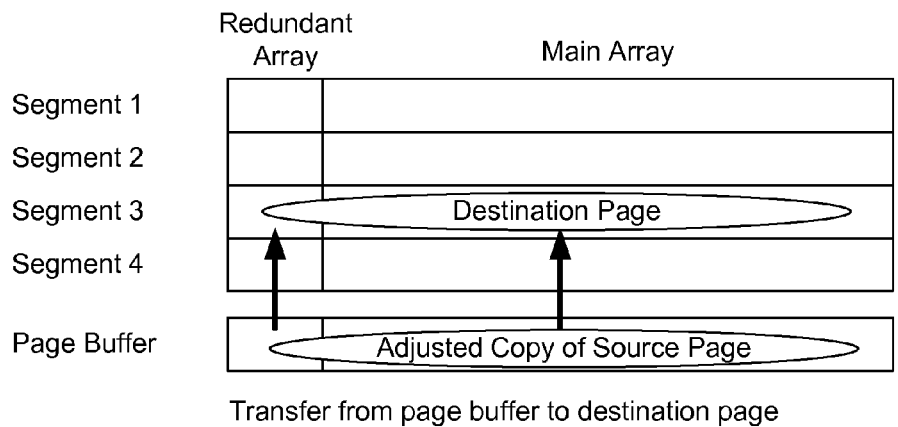

FIGS. 5-7 are diagrams of a memory array and a page buffer, showing steps in the copy back programming operation, where the memory array includes a main memory array and a redundant memory array, and the page buffer includes a main page buffer and a redundant page buffer.

FIG. 5 shows that the source page in redundancy segment 1 of the memory array of the memory array is copied to the page buffer. More particularly, the data in the main array part of the source page is copied to the main page buffer, and the data in the redundant array part of the source page is copied to the redundant page buffer. Afterwards, the page buffer has a copy of the source page. In one embodiment, a memory page is 256 bytes; other embodiments have different size pages.

FIG. 6 shows that the copy of the source page in the page buffer is adjusted as discussed herein. Afterwards, the contents of the page buffer are adjusted to account for the source page redundancy assignment and the destination page redundancy assignment.

FIG. 7 shows that data is transferred from the page buffer to the destination page in redundancy segment 3 of the memory array. More particularly, the data in the main page buffer is transferred to the main array part of the destination page, and the data in the redundant page buffer is transferred to the redundant array part of the destination page. Afterwards, the destination page has a copy of the source page.

FIG. 8 shows a memory array divided into multiple redundancy segments, where defects of the main array in a particular redundancy segment are repaired by the redundant array in the same redundancy segment.

In this example arrangement, the main array is divided into redundancy segments as follows. The redundancy segments SEG1, SEG2, SEG3, SEG4 divide both the main array and the redundant array. Other embodiments have a different number of redundancy segments. Blocks 0-255 of the main array are in redundancy segment 1, blocks 256-511 of the main array are in redundancy segment 2, blocks 512-767 of the main array are in redundancy segment 3, and blocks 768-1023 of the main array are in redundancy segment 4. Other embodiments have a different number of blocks in the different segments. According to this arrangement, a defect in a particular block of the main array is fixed by the redundant array in the assigned redundancy segment. Multiple redundancy segments improve efficiency, because then a particular unit of the redundant array, such as a redundant column, can fix defects in the main array that are in different redundancy segments.

FIG. 9 shows a source page redundancy assignment within a particular redundancy segment, where particular parts of the source page in the redundant memory array are assigned to repair particular parts of the source page in the main array that have one or more defects.

The source page is in redundancy segment 1 of the memory array. Defects are in the main array parts M3 and M6 of the source page. These defects are replaced by the source page redundancy assignment, of parts of the redundant array R1 and R2 of the source page, to the main array parts M3 and M6 of the source page. Because of the source page redundancy assignment, memory operations such as read, program, and erase which are addressed to main array parts M3 and M6 of the source page, are actually performed on respective parts of the redundant array R1 and R2 of the source page.

FIG. 10 shows a destination page redundancy assignment within a particular redundancy segment, where particular parts of the destination page in the redundant memory array are assigned to repair particular parts of the destination page in the main array that have one or more defects.

The destination page is in redundancy segment 3 of the memory array. Defects are in the main array parts M1, M3, and M7 of the destination page. These defects are replaced by the destination page redundancy assignment, of parts of the redundant array R1-R3 of the destination page, to the main array parts M1, M3, and M7 of the destination page. Because of the destination page redundancy assignment, memory operations such as read, program, and erase which are addressed to main array parts M1, M3, and M7 of the destination page, are actually performed on respective parts of the redundant array R1-R3 of the destination page.

A copy back programming operation from the source page to a destination page accounts for the source page redundancy assignment, example shown in FIG. 9, and for the destination page redundancy assignment, example shown in FIG. 10.

FIG. 11 shows a table of signal values for different steps and different phases in the different steps, of the internal page buffer data move operation.

The list below has an explanation of the various signals in FIG. 11.

YREDx: include YRED1-YRED3, Select R1-R3
   YRED1: select R1 for data in/out
   YRED2: select R2 for data in/out
   YRED3: select R3 for data in/out
YDISABLE: Disable the Normal Y data in/out path (When YREDx ≠0)
SEGx RED: The Y Redundancy Register circuit for Segment x. (include SEG1~4 RED)

SEG1 RED: The Red. Circuit for Segment 1
SEG2 RED: The Red. Circuit for Segment 2
SEG3 RED: The Red. Circuit for Segment 3
SEG4 RED: The Red. Circuit for Segment 4
YPREDECODER: This circuit decodes YADDR_PB for M1~M8 path selection.
YMUX: Select the Data in/out path from R1-R3 & M1-M8.
YADDR_PB: Y Address for Page Buffer (Select among Redundancy YADD and Normal Y Address)
YADDR: Normal Y Address
Ymn: Select M1-M8

The different steps and different phases in an internal page data move operation are described with reference to the table of FIG. 11. Also, the different steps and different phases in an internal page buffer data move operation are described with reference to FIGS. 12, 13, and 14-16 which are block diagrams of a page buffer and other circuitry in the copy back programming operation.

The page buffer of FIGS. 12, 13, and 14-16 includes a redundant page buffer and main page buffer. The redundant page buffer includes parts R1, R2, R3. The main page buffer includes parts M1, M2, M3, M4, M5, M6, M7, M8. Other embodiments have a different number of parts in the redundant page buffer and/or main page buffer.

The temporary registers, or redundancy registers, of FIGS. 12, 13, and 14-16 include parts TR1, TR2, TR3. The number of parts in the redundant page buffer matches the number of parts in the temporary registers. Other embodiments have a different number of parts in the temporary registers.

A short description of the copy back programming operation are described in the table of FIG. 11, and block diagrams of FIGS. 12-16 follows.

During Step 1, the active parts R1-R3 of the redundant page buffer are copied into the temporary registers TR1-TR3. During Step 2, the active ones of the temporary registers TR1-TR3 are copied into corresponding ones of the parts M1-M8 of the main page buffer. Correspondence between the temporary register positions TR1-TR3 and main page buffer positions M1-M8 is determined by the source page redundancy assignment that replaced the set of defects at positions M1-M8 of the source page with positions R1-R3 of the redundant memory of the source page. During Step 3, parts M1-M8 of the main page buffer are copied into corresponding ones of the redundant registers R1-R3 of the redundant page buffer. Correspondence between the redundant register positions R1-R3 and main page buffer positions M1-M8 is determined by the destination page redundancy assignment that replaced the set of defects at positions M1-M8 of the destination page with positions R1-R3 of the redundant memory of the destination page.

In another example, Steps 2 and 3 are reversed, such as described below in FIG. 17.

A more detailed description follows, of the copy back programming operation described in the table of FIG. 11 and block diagrams of FIGS. 12-16.

Figure 12:
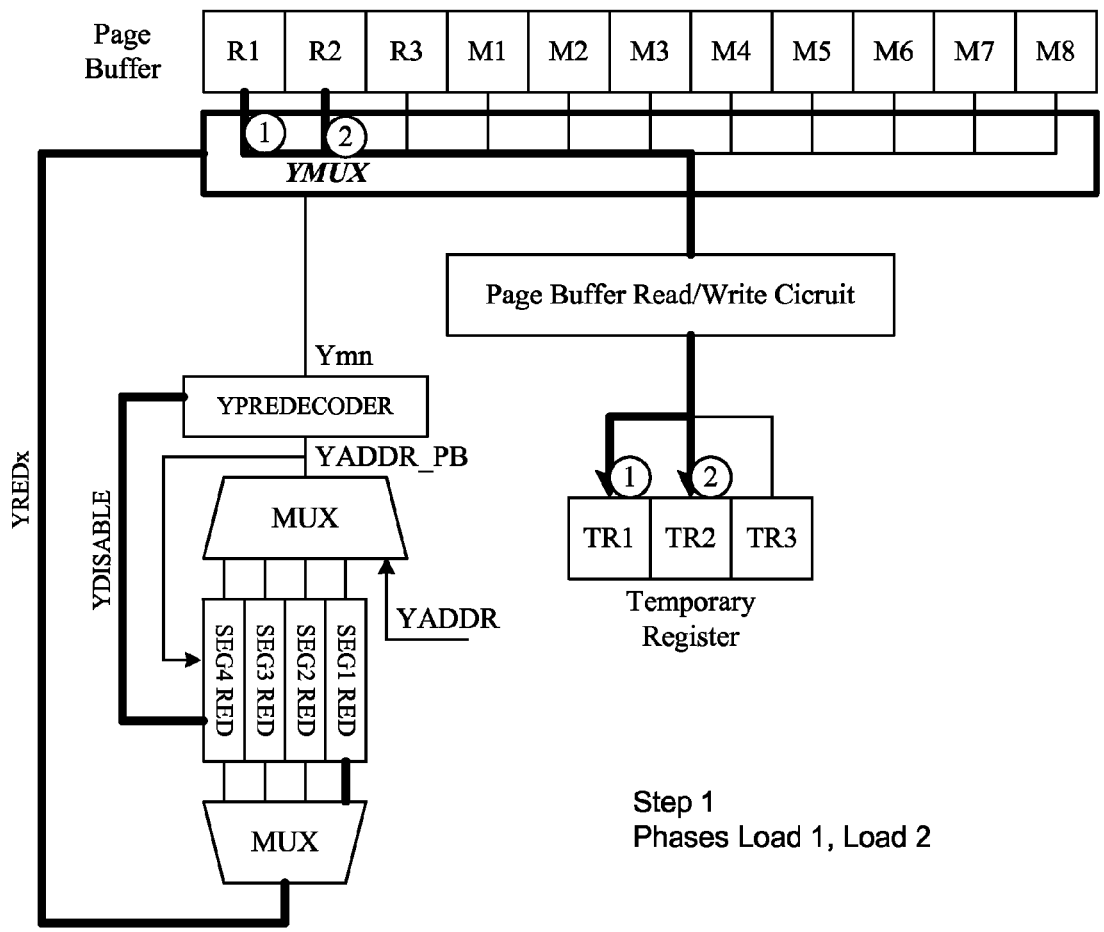
FIG. 12 is a block diagram of a page buffer and other circuitry in the copy back programming operation, during the step of transferring data from the page buffer to the temporary registers, particularly from the page buffer portion including the redundant page buffer.

During Step 1, the data of the redundant page buffer is stored in temporary registers. FIG. 12 is a block diagram of the page buffer and other circuitry during Step 1. In FIG. 12, the circled 1 and the circled 2 indicate the respective load phases Load 1 and Load 2.

In this example, two parts R1, R2 of the three parts R1, R2, R3 of the redundant page buffer are active. So during Step 1, two load phases Load 1 and Load 2 copy the two active parts R1, R2 of the redundant page buffer to the two temporary registers TR1, TR2 of the three temporary registers TR1, TR2, TR3. In another example, fewer parts of the redundant page buffer are active, requiring fewer load phases. In another example, more parts of the redundant page buffer are active, requiring more load phases. In another example, different parts of the redundant page buffer are active.

In load phase Load 1, R1 of the redundant page buffer is copied to TR1 of the temporary registers. Because R1 of the redundant page buffer is accessed, signal YRED1 is 1 and the other signals YRED2 and YRED3 are 0. Because at least one of the signals YREDx is 1, YDISABLE is 1. YADDR_PB is don't care, because the identity R1, R2 of the active parts of the redundant page buffer is sufficient for Step 1. Ymn is 0, because the main page buffer M1-M8 is not accessed. MUX for YREDx has selected the redundancy segment circuit SEG1, which accesses the identity R1, R2 of the active parts of the redundant page buffer. MUX for YADDR_PB is don't care, because the main page buffer M1-M8 is not accessed.

In load phase Load 2, R2 of the redundant page buffer is copied to TR2 of the temporary registers. Because R2 of the redundant page buffer is accessed, signal YRED2 is 1 and the other signals YRED1 and YRED3 are 0.

During Step 2, the data of the temporary registers is written to the page buffer. This is determined by the source page redundancy assignment which replaced the set of defects in the main array positions M1-M8 of the source page with particular parts of the redundant memory R1-R3 of the corresponding redundancy segment SEG1-SEG4 of the source page. In some cases this may also be determined by the destination page redundancy assignment which replaced the set of defects in the main array positions M1-M8 M8 of the destination page with particular parts of the redundant memory R1-R3 of the corresponding redundancy segment SEG1-SEG4 of the destination page.

In this example, two parts TR1, TR2 of the three parts TR1, TR2, TR3 of the temporary registers are active. So during Step 2, two write phases Write 1 and Write 2 transfer the two parts TR1, TR2 of the temporary registers to corresponding ones of the parts M1-M8 of the main page buffer. However, in some cases, transfer to corresponding ones of the parts M1-M8 of the main page buffer may be redirected to corresponding ones of the parts R1-R3 of the redundant page buffer. Correspondence between the temporary register positions TR1-TR3 and main page buffer positions M1-M8 is determined by the source page redundancy assignment that replaced the set of defects at positions M1-M8 of the main source page with positions R1-R3 of the redundant source page.

However, the destination page redundancy assignment replaced the set of defects at positions M1-M8 of the main destination page with positions R1-R3 of the redundant destination page. If any of the positions M1-M8 are in both the source page redundancy assignment and the destination page redundancy assignment, then the transfer to corresponding ones of the parts M1-M8 of the main page buffer is redirected to corresponding ones of the parts R1-R3 of the redundant page buffer. The corresponding ones of the parts R1-R3 of the redundant page buffer are determined by the destination page redundancy assignment.

In another example, fewer parts of the temporary registers hold data, requiring fewer write phases. In another example, more parts of the temporary registers are hold data, requiring more write phases. In another example, different parts of the temporary registers hold data for the write phases.

Figure 13:
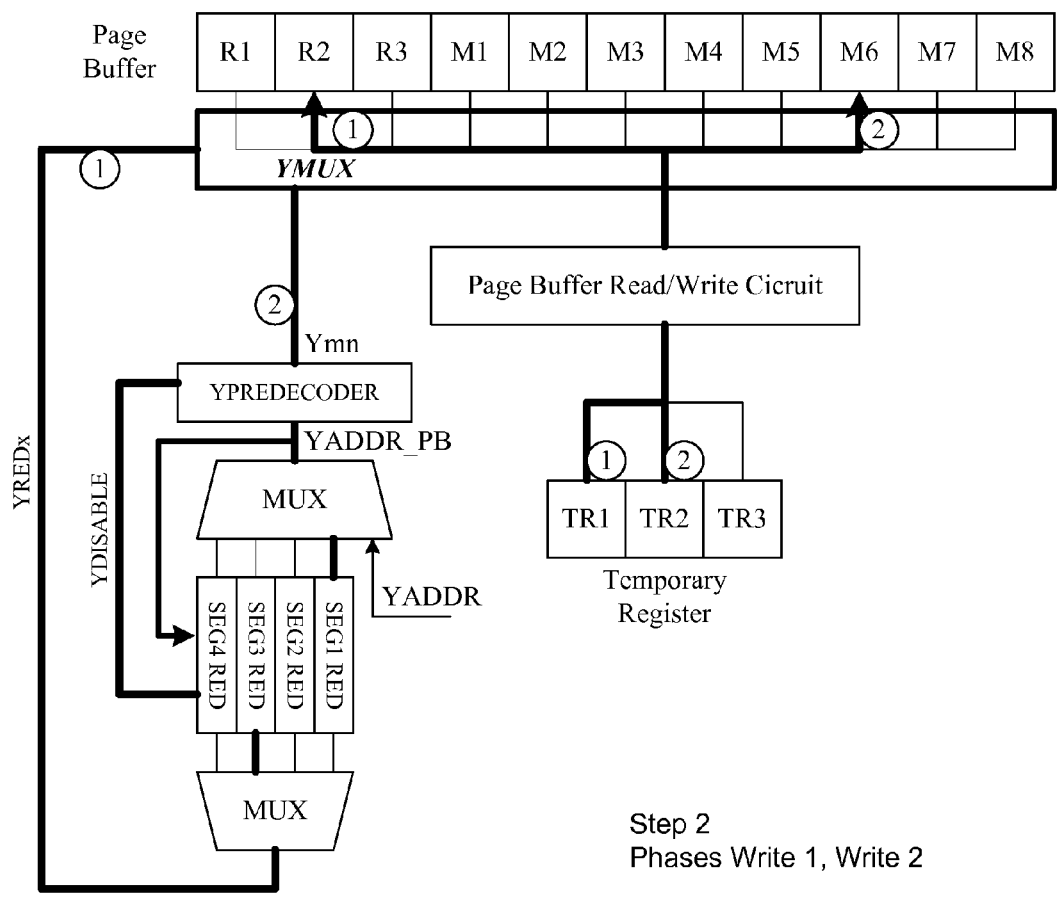
FIG. 13 is a block diagram of a page buffer and other circuitry in the copy back programming operation, during the step of transferring data from temporary registers to the page buffer, accounting for the source page redundancy assignment.

FIG. 13 is a block diagram of the page buffer and other circuitry during Step 2. In FIG. 13, the circled 1 and the circled 2 indicate the respective write phases Write 1 and Write 2.

In write phase Write 1, the data of temporary register TR1 is transferred to R2 of the redundant page buffer. The source page redundancy assignment repaired position M3 of the main source page with position R1 of the redundant source page. The source page redundancy assignment indicates initially that the data of temporary register TR1 is transferred to position M3 of the main page buffer. However, the destination page redundancy assignment repaired position M3 of the main destination page with position R2 of the redundant destination page. Main address M3 is shared by the source page redundancy assignment and the destination page redundancy assignment. So instead, the data of temporary register TR1 is transferred to R2 of the redundant page buffer.

Correspondences between the redundancy address and the main address for the different memory pages, is stored for the different redundancy segments in the redundancy circuits, also called the SEGx RED circuits. By providing the normal Y address YADDR to the MUX, the redundancy circuits enable redundant memory responsive to a matching address. For redundancy match comparison, the redundancy circuits provide signal YADDR_PB, the Y address which is a main address. In normal operation, YADDR_PB selects the YADDR path. In special cases, SEGm RED YADDR is chosen for the SEGn RED redundancy match comparison. For example, as shown in FIG. 13, in write phase Write 1 of Step 2, the SEG1 RED redundancy circuit outputs YADDR_PB=main address M3 to redundancy circuit SEG3 RED for the redundancy address match. Then, as shown in FIG. 13, YRED2 is 1 since the main address M3 is repaired by redundant address R2 for redundancy circuit SEG3 RED.

Because of the data transfer to R2 of the redundant page buffer, signal YRED2 is 1 and the other signals YRED1 and YRED3 are 0. Because at least one of the signals YREDx is 1, YDISABLE is 1. YADDR_PB is M3, because the SEG1 RED circuit—for the source page—corresponds main address M3 with redundant address R1/TR1. Ymn is 0, because the main page buffer M1-M8 is not accessed. MUX for YREDx has selected the redundancy segment circuit SEG3—for the destination page—which corresponds main address M3 with redundant address R2. MUX for YADDR_PB is SEG1, because SEG1 RED circuit corresponds the redundant address TR1 with main address M3. The ongoing redundancy comparison to determine whether the same main address M3 represents a defective position of both the source page and destination page.

In write phase Write 2, the data of temporary register TR2 is transferred to M6 of the main page buffer. The source page redundancy assignment repaired position M6 of the main source page with position R2 of the redundant source page. The source page redundancy assignment indicates that the data of temporary register TR2 is transferred to position M6 of the main page buffer.

Because of no data access with positions R1-R3 of the redundant page buffer, signals YRED1, YED2, YRED3 are 0. Because none of the signals YREDx is 1, YDISABLE is 0. YADDR_PB is M6, because the SEG1 RED circuit—for the source page—corresponds main address M6 with redundant address R2/TR2. Ymn is M6, because the main page buffer position M6 is written. MUX for YREDx has selected the redundancy segment circuit SEG3—for the destination page—to check whether a same main address is shared between the source and destination pages. MUX for YADDR_PB is SEG1, because SEG1 RED circuit corresponds the redundant address TR2 with main address M6. The ongoing redundancy comparison to determine whether the same main address M6 represents a defective position of both the source page and destination page.

During Step 3, parts M1-M8 of the main page buffer are copied into corresponding ones of the redundant registers R1-R3. Correspondence between the redundant register positions R1-R3 and main page buffer positions M1-M8 is determined by the destination page redundancy assignment that replaced the set of defects at positions M1-M8 of the destination page with positions R1-R3 of the redundant memory of the destination page. However, copying or transferring from parts M1-M8 of the main page into corresponding ones of the redundant registers R1-R3 is skipped, in cases where a main address M1-M8 was repaired in both the source page redundancy assignment and the destination page redundancy assignment; in such cases the copying or transferring from parts M1-M8 of the main page into corresponding ones of the redundant registers R1-R3 already occurred in Step 2.

In this example, all three parts R1, R2, and R3 of the redundant page buffer are active. So during Step 3, three read phases Read 1, Read 2, and Read 3 read the parts M1-M8 of the main page buffer which are present in the destination page redundancy assignment. Also during Step 3, after each read phase, a write phase writes the data from the main page buffer, into the corresponding ones of the parts R1-R3 of the redundant page buffer. Correspondence between the register positions R1-R3 of the redundant page buffer and main page buffer positions M1-M8 is determined by the destination page redundancy assignment that replaced the set of defects at positions M1-M8 of the main destination page with positions R1-R3 of the redundant destination page. However, a write phase is skipped, if the preceding read phase read data from a main address M1-M8 that was repaired in both the source page redundancy assignment and the destination page redundancy assignment. Accordingly, in this example, the write phase Write 1 follows the read phase Read 1, and the write phase Write 3 follows the read phase Read 3, but a write phase is skipped after read phase Read 2.

Figure 14:
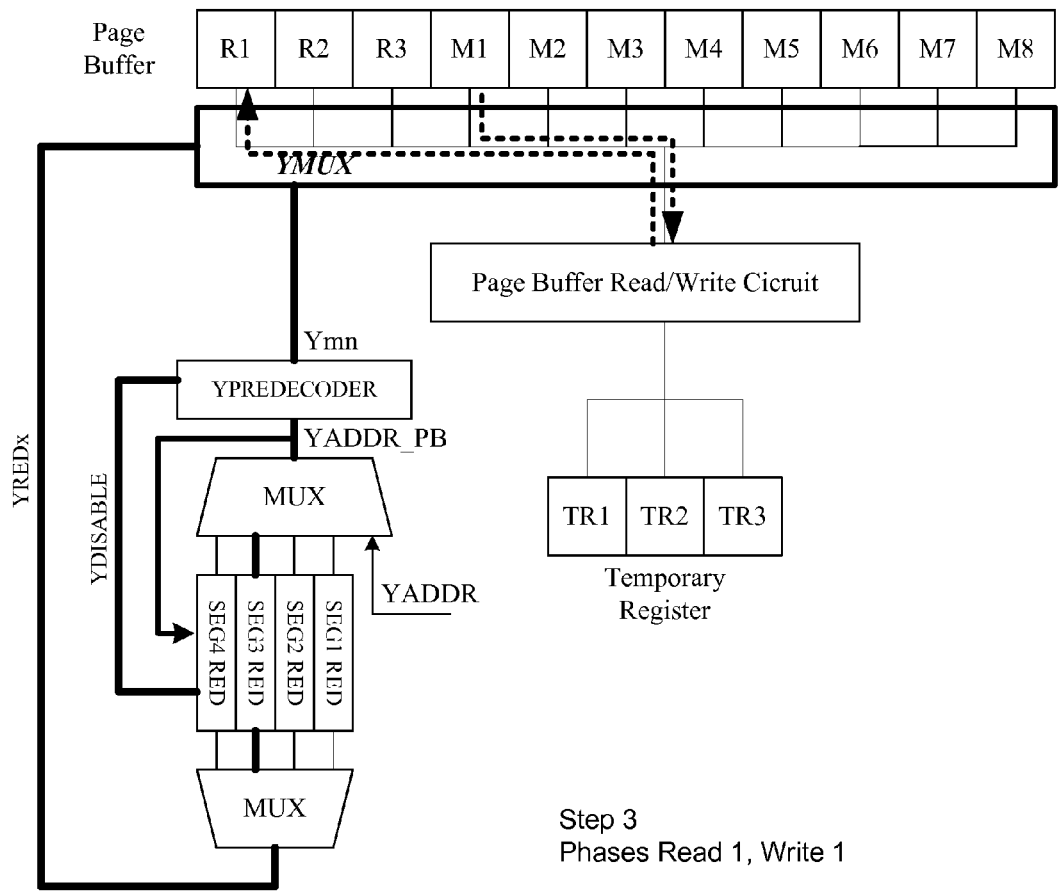
FIGS. 14-16 are block diagrams of a page buffer and other circuitry in the copy back programming operation, during the step of transferring data within the page buffer, in particular from the main page buffer to the redundant page buffer, accounting for the destination page redundancy assignment.

FIG. 14 is a block diagram of the page buffer and other circuitry during Step 3, Phases Read 1 and Write 1.

In read phase Read 1, the data of position M1 of the main page buffer is read. In write phase Write 1, data of position M1 of the main page buffer is written to R1 of the redundant page buffer. The destination page redundancy assignment repaired position M1 of the main destination page with position R1 of the redundant destination page. The read phase Read 1 and the write phase Write 1 are discussed further.

During read phase Read 1, because of no data access with positions R1-R3 of the redundant page buffer, signals YRED1, YED2, YRED3 are 0. Because none of the signals YREDx is 1, YDISABLE is 0. YADDR_PB is M1, because the SEG3 RED circuit—for the destination page—corresponds main address M1 with redundant address R1. Ymn is M1, because the main page buffer position M1 is read. MUX for YREDx has selected the redundancy segment circuit SEG3—for the destination page. MUX for YADDR_PB is SEG3, because SEG3 RED circuit corresponds the redundant address R1 with main address M1. The ongoing redundancy comparison determines whether the same main address M1 represents a defective position of both the source page and destination page.

During write phase Write 1, because of the data transfer to R1 of the redundant page buffer, signal YRED1 is 1 and the other signals YRED2 and YRED3 are 0. Because at least one of the signals YREDx is 1, YDISABLE is 1. YADDR_PB is M1, because the SEG3 RED circuit—for the destination page—corresponds main address M1 with redundant address R1. Ymn is 0, because the main page buffer M1-M8 is not accessed. MUX for YREDx has selected the redundancy segment circuit SEG3—for the destination page. MUX for YAD- DR_PB is SEG3, because SEG3 RED circuit corresponds the redundant address R1 with main address M1. There is no ongoing redundancy comparison to determine whether the same position of the main page buffer represents a defective position of both the source page and destination page.

Figure 15:
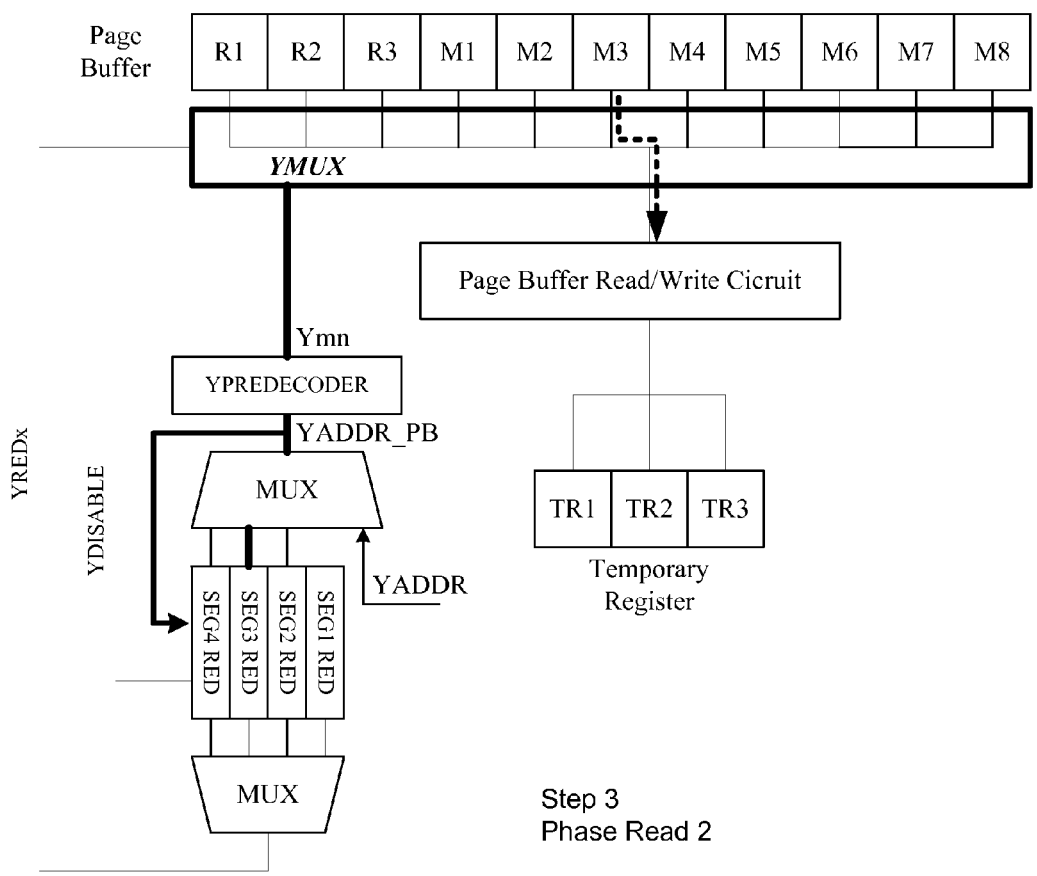

FIG. 15 is a block diagram of the page buffer and other circuitry during Step 3, Phase Read 2.

In read phase Read 2, the data of position M3 of the main page buffer is read. There is no write phase Write 2, which is skipped. Details of the read phase Read 2 are generally similar to the read phase Read 1, except for the position of the main page buffer being read.

Figure 16:
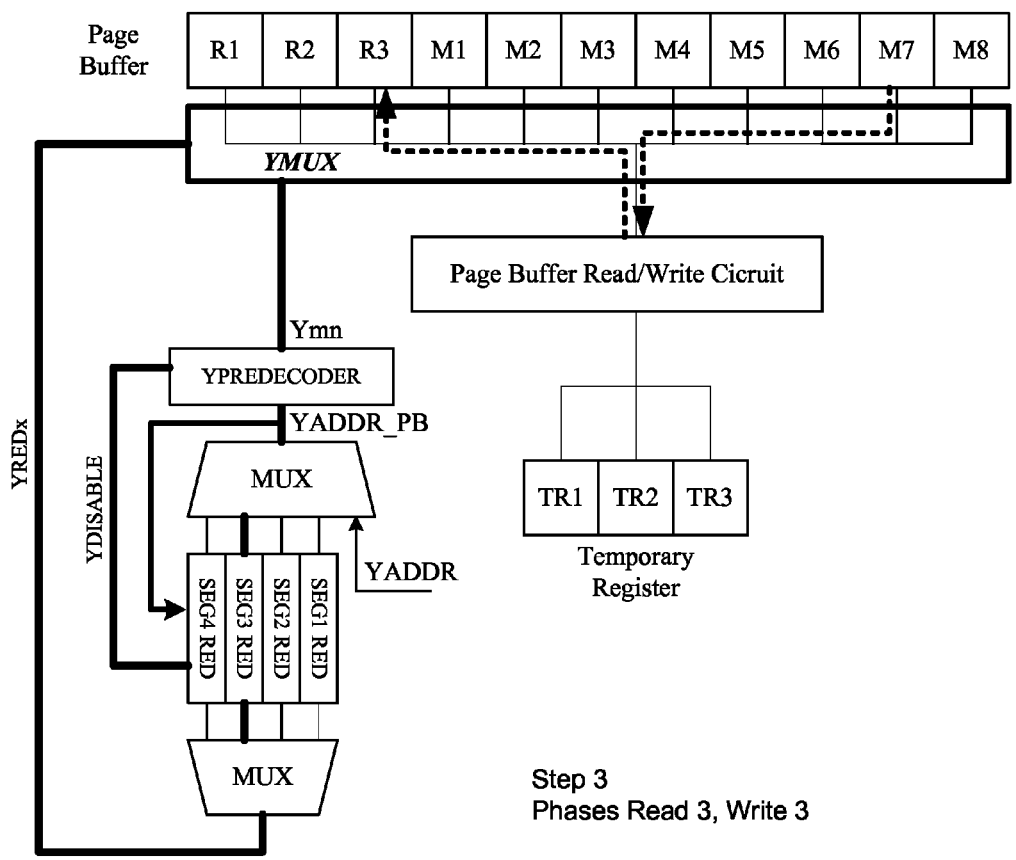

FIG. 16 is a block diagram of the page buffer and other circuitry during Step 3, Phases Read 3 and Write 3.

In read phase Read 3, the data of position M7 of the main page buffer is read. In write phase Write 3, data of position M7 of the main page buffer is written to R3 of the redundant page buffer. The destination page redundancy assignment repaired position M7 of the main destination page with position R3 of the redundant destination page. Details of the read phase Read 3 are generally similar to the read phase Read 1, except for the position of the main page buffer being read. Details of the write phase Write 3 are generally similar to the write phase Write 1, except for the position of the redundant page buffer being written.

FIG. 17 shows a table of signal values for different steps and different phases in the different steps, of a copy back programming operation, where the steps are in a different order than the table of FIG. 11.

FIGS. 11 and 17 are compared. Step 1 is the same for FIGS. 11 and 17. Step 2 in FIG. 17 resembles Step 3 in FIG. 11. However, Step 2 in FIG. 17 includes the additional write phase Write 2 after the read phase Read 2. Step 3 in FIG. 17 is the same as the Step 2 in FIG. 11.

Figure 18:
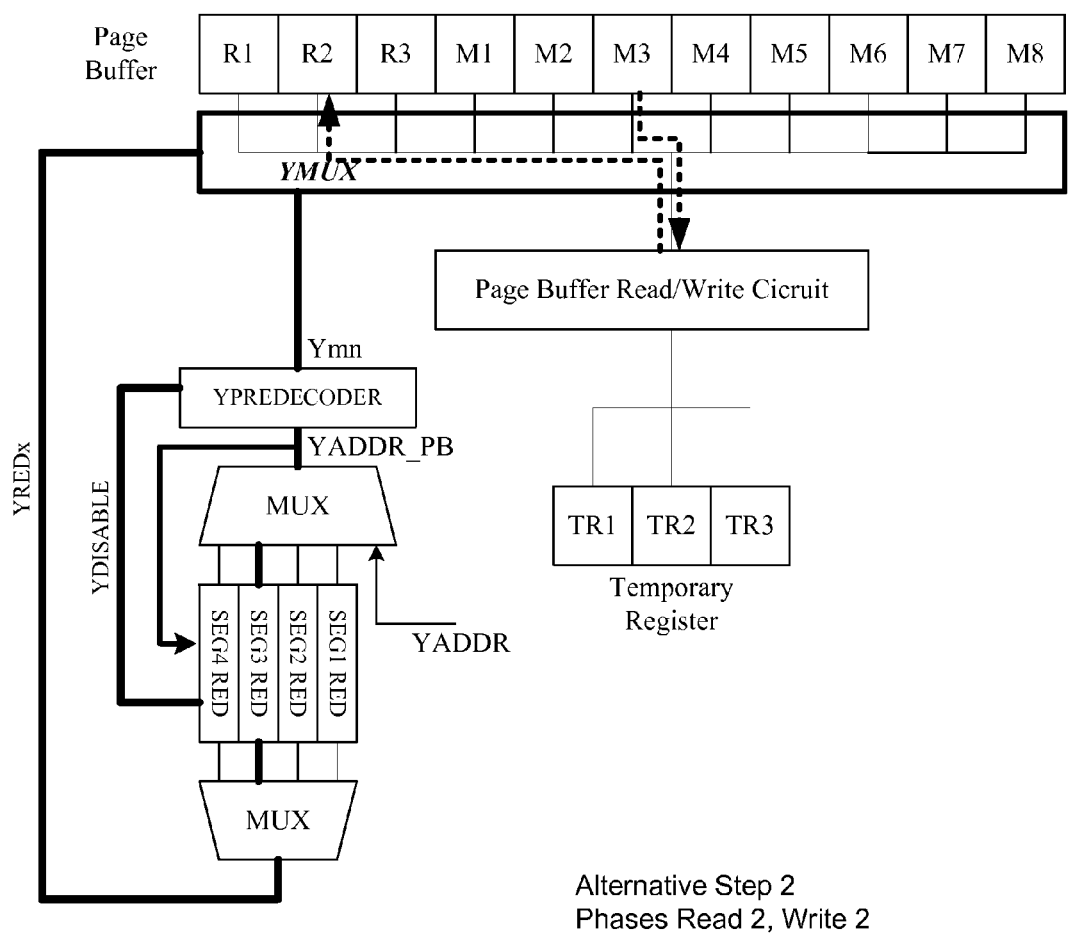
FIG. 18 is a block diagram of a page buffer and other circuitry in the copy back programming operation, during the step of transferring data within the page buffer, in particular from the main page buffer to the redundant page buffer, accounting for the destination page redundancy assignment, showing a modification of a similar data transfer of FIG. 15.

FIG. 18 is a block diagram of the page buffer and other circuitry during Step 2, Phases Read 2 and Write 2. FIG. 18 contrasts with Step 3 in FIG. 11 in which the read phase Read 2 was not followed by the write phase Write 2.

Figure 19:
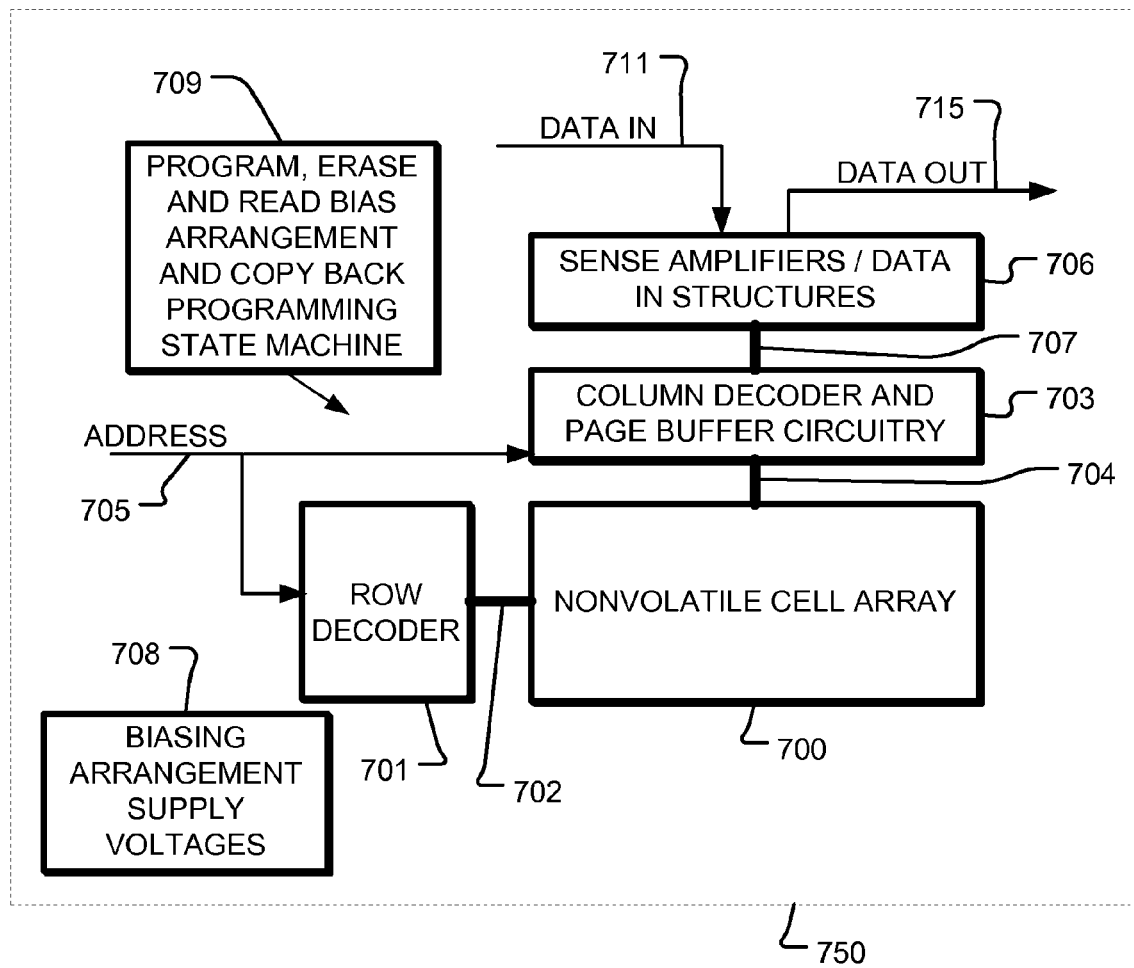
FIG. 19 is a block diagram of an integrated circuit with the disclosed copy back programming operation and page buffer.

FIG. 19 is a block diagram of an integrated circuit with the disclosed copy back programming operation and page buffer.

An integrated circuit 750 includes a memory array 700. A word line decoder 701 is coupled to and in electrical communication with a plurality of word lines 702 arranged along rows in the memory array 700. A bit line (column) decoder and page buffer circuitry 703 is in electrical communication with a plurality of bit lines 704 arranged along columns in the array 700. Addresses are supplied on bus 705 to the word line decoder 701 and bit line decoder and page buffer circuitry 703. Sense circuitry (Sense amplifiers) and data-in structures in block 706, including voltage and/or current sources are coupled to bit line decoder and page buffer circuitry 703 via data bus 707. Data is supplied via a data-in line 711 from input/output ports on integrated circuit 750, or from other data sources internal or external to integrated circuit 750, to data-in structures in block 706. Other circuitry may be included on integrated circuit 750, such as a general purpose processor or special purpose application circuitry, or a combination of modules providing system-on-a-chip functionality supported by array 700. Data is supplied via a data-out line 715 from the sense amplifiers in block 706 to input/output ports on integrated circuit 750, or to other data destinations internal or external to integrated circuit 750.

A controller 709 implemented in this example, using a bias arrangement state machine, controls the application of bias circuitry voltage and current sources 708 for the application of bias arrangements including read, program, erase, erase verify and program verify voltages and/or currents for the word lines and bit lines. The controller 709 also performs the copy back programming that accounts for the source page redundancy assignment and the destination page redundancy assignment with one or more changes to data in the page buffer in column decoder and page buffer circuitry 703. Controller 709 may be implemented using special-purpose logic circuitry as known in the art. In alternative embodiments, controller 709 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 709.

In various embodiments, "copy" is a data manipulation that results in the same data at the source and destination. In various embodiments, "transfer" is a data manipulation that results in the data from the source ending up at the destination, where the source data may or may not be changed.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A memory device comprising:
a memory array arranged into:
a main array divided into a plurality of segments, the main array having a quantity of main array columns; and
a redundant array having a quantity of redundant array columns, the redundant array divided into the plurality of segments corresponding to the main array,
wherein a set of defective positions in a particular segment of the main array is replaced by redundant memory in a corresponding particular segment of the redundant array, the set of defective positions positioned in a subset of the quantity of main array columns of the main array, the subset smaller than the quantity of redundant array columns;
control circuitry supporting a page copy operation between a source page of the memory array and a destination page of the memory array in different segments of the plurality of segments, the source page located in the main array and the redundant array, the destination page located in the main array and the redundant array, the page copy operation transferring data from a part of the source page in the redundant array to a part of the destination page in the main array.

2. The memory device of claim 1,
wherein the page copy operation is a copy back programming operation that copies data from the source page of the memory array to the destination page of the memory array, without transporting the data in and out of the memory device.

3. The memory device of claim 1,
wherein the page copy operation is a copy back programming operation that copies data from the source page of the memory array to the destination page of the memory array, and performs at least one of: transferring data out of the memory device and transferring data into the memory device.

4. The memory device of claim 1,
wherein the main array is arranged into rows and columns, the redundant array includes a set of redundant columns, and the segments divide the columns of the main array and the set of redundant columns of the redundant array into sets of rows, such that a set of defective positions in a particular set of rows of the main array are replaced by redundant memory in the particular set of rows of the redundant columns.

5. The memory device of claim 1, further comprising:
a page buffer including a main page buffer corresponding to the main array and a redundant page buffer corresponding to the redundant array, wherein
the control circuitry supports the page copy operation, with one or more changes to data in the page buffer having a copy of the source page.

6. The memory device of claim 1, further comprising:
a page buffer including a main page buffer corresponding to the main array and a redundant page buffer corresponding to the redundant array, wherein
a source page redundancy assignment replaces the set of defective positions in the main array of the source page with particular parts of the redundant memory of the corresponding segment of the source page,
a destination page redundancy assignment replaces the set of defective positions in main array of the destination page with particular parts of the redundant memory of the destination page, and
the control circuitry supports the page copy operation, with one or more changes to data in the page buffer having a copy of the source page, the one or more changes accounting for the source page redundancy assignment and for the destination page redundancy assignment.

7. The memory device of claim 1, further comprising:
a page buffer including a main page buffer corresponding to the main array and a redundant page buffer corresponding to the redundant array; and
temporary registers corresponding to the redundant page buffer, wherein
the source page has parts including a main source page in the main array and a redundant source page in the redundant array,
the destination page has parts including a main destination page in the main array and a redundant destination page in the redundant array,
a main addressing scheme is shared by the main source page, the main destination page, and the main page buffer, such that a main address of the main addressing scheme identifies corresponding parts of the main source page, the main destination page, and the main page buffer;
a redundant addressing scheme is shared by the redundant source page, the redundant destination page, the redundant page buffer, and the temporary registers, such that a redundant address of the redundant addressing scheme identifies corresponding parts of the redundant source page, the redundant destination page, the redundant page buffer, and the temporary registers;
a source page redundancy assignment replaces the set of defective positions in the main source page with particular parts of the redundant source page, by assigning one or more redundant addresses of the redundant source page to replace one or more main addresses of the set of defective positions in the main source page,
a destination page redundancy assignment replaces the set of defective positions in the main destination page with particular parts of the redundant destination page, by assigning one or more redundant addresses of the redundant destination page to replace one or more main addresses of the set of defective positions in the main destination page.

8. The memory device of claim 7,
wherein the main address is identical for parts of the main array in a same column of the memory array, and
wherein the redundant address is identical for parts of the redundant array in a same column of the redundant array.

9. The memory device of claim 7, wherein the control circuitry supports the page copy operation, by performing:
copying the source page into the page buffer and the temporary registers, such that the main source page is copied to the main page buffer and the redundant source page is copied to the redundant page buffer and the temporary registers; and then
transferring data from at least one particular redundant address of the temporary registers to at least one particular main address of the main page buffer, wherein the source page redundancy assignment repaired the at least one particular main address of the main source page with the at least one particular redundant address of the redundant source page.

10. The memory device of claim 7, wherein the control circuitry supports the page copy operation, by performing:
copying the source page into the page buffer and the temporary registers, such that the main source page is copied to the main page buffer and the redundant source page is copied to the redundant page buffer and the temporary registers; and then
transferring data from at least one particular main address of the main page buffer to at least one particular redundant address of the redundant page buffer, wherein the destination page redundancy assignment repaired the at least one particular main address of the main destination page with the at least one particular redundant address of the redundant destination page.

11. The memory device of claim 7, wherein the control circuitry supports the page copy operation, by performing:
copying the source page into the page buffer and the temporary registers, such that the main source page is copied to the main page buffer and the redundant source page is copied to the redundant page buffer and the temporary registers;
transferring data from a first set of one or more particular redundant addresses of the temporary registers to a first set of one or more particular main addresses of the main page buffer, wherein the source page redundancy assignment repaired the first set of one or more particular main addresses of the main source page with the first set of one or more particular redundant addresses of the redundant source page; and then
transferring data from a second set of one or more particular main addresses of the main page buffer to a second set of one or more particular redundant addresses of the redundant page buffer, wherein the destination page redundancy assignment repaired the second set of one or more particular main addresses of the main destination page with the second set of one or more particular redundant addresses of the redundant destination page.

12. The memory device of claim 7, wherein the control circuitry supports the page copy operation, by performing:
copying the source page into the page buffer and the temporary registers, such that the main source page is copied to the main page buffer and the redundant source page is copied to the redundant page buffer and the temporary registers;

transferring data from a first set of one or more particular main addresses of the main page buffer to a first set of one or more particular redundant addresses of the redundant page buffer, wherein the destination page redundancy assignment repaired the first set of one or more particular main addresses of the main destination page with the first set of one or more particular redundant addresses of the redundant destination page; and then transferring data from a second set of one or more particular redundant addresses of the temporary registers to a second set of one or more particular main addresses of the main page buffer, wherein the source page redundancy assignment repaired the second set of one or more particular main addresses of the main source page with the second set of one or more particular redundant addresses of the redundant source page.

13. The memory device of claim 7, wherein the control circuitry supports the page copy operation, by performing:

copying the source page into the page buffer and the temporary registers, such that the main source page is copied to the main page buffer and the redundant source page is copied to the redundant page buffer and the temporary registers;

responsive to the source page redundancy assignment and the destination page redundancy assignment repairing a same main address of the main source page and the main destination page, transferring data from a first redundant address of the temporary registers to a second redundant address of the redundant page buffer, wherein the source page redundancy assignment repaired the same main address of the main source page with the first redundant address of the redundant source page, and the destination page redundancy assignment repaired the same main address of the main destination page with the second redundant address of the redundant destination page.

14. The memory device of claim 7, wherein the control circuitry supports the page copy operation, by performing:

copying the source page into the page buffer and the temporary registers, such that the main source page is copied to the main page buffer and the redundant source page is copied to the redundant page buffer and the temporary registers;

responsive to the source page redundancy assignment and the destination page redundancy assignment repairing a same main address of the main source page and the main destination page, transferring data from a first redundant address of the temporary registers to a second redundant address of the redundant page buffer, wherein the source page redundancy assignment repaired the same main address of the main source page with the first redundant address of the redundant source page, and the destination page redundancy assignment repaired the same main address of the main destination page with the second redundant address of the redundant destination page; and then transferring data from at least one particular main address of the main page buffer to at least one particular redundant address of the redundant page buffer, except for cases where the at least one particular main address includes the same main address, wherein the destination page redundancy assignment repaired the at least one particular main address of the main destination page with the at least one particular redundant address of the redundant destination page.

15. The memory device of claim 1,
wherein the page copy operation transfers data from a part of the source page in the main array to a part of the destination page in the redundant array.

16. The memory device of claim 1,
wherein the control circuitry replaces the set of defective positions in the particular segment of the main array, by redundant memory in the corresponding particular segment of the redundant array, such that memory operations that address the set of defective positions in the particular segment of the main array are redirected to the redundant memory in the corresponding particular segment of the redundant array.

17. A method of operating memory, comprising:
replacing a set of defective positions in a particular segment of a main array having a quantity of main array columns with redundant memory in a corresponding particular segment of a redundant array having a quantity of redundant array columns, the set of defective positions positioned in a subset of the quantity of main array columns of the main array, the subset smaller than the quantity of redundant array columns; and performing a page copy operation between a source page of the memory array and a destination page of the memory array in different segments of a plurality of segments dividing the memory array, the source pa e located in the main array and the redundant array, the destination page located in the main array and the redundant array, the page copy operation including a transfer operation that transfers data from a part of the source page in the redundant array to a part of the destination page in the main array, wherein the transfer operation precedes a phase of copying data from a page buffer to the destination page.

18. The method of claim 17,
wherein the page copy operation is a copy back programming operation that copies data from the source page of the memory array to the destination page of the memory array, without transporting the data in and out of the memory device.

19. The method of claim 17,
wherein the page copy operation is a copy back programming operation that copies data from the source page of the memory array to the destination page of the memory array , and performing at least one of transferring data out of the memory device and transferring data into the memory device.

20. The method of claim 17,
wherein a main array of the memory array is arranged into rows and columns, the redundant array includes a set of redundant columns, and the segments divide the columns of the main array and the set of redundant columns of the redundant array into sets of rows, such that a set of defective positions in a particular set of rows of the main array are replaced by redundant memory in the particular set of rows of the redundant columns.

21. The method of claim 17,
wherein the page copy operation makes one or more changes to data in a page buffer of the memory array, the page buffer having a copy of the source page, the one or more changes accounting for a source page redundancy assignment and for a destination page redundancy assignment, the source page redundancy assignment replaces the set of defective positions in a main array part of the source page with particular parts of the redundant memory of a corresponding segment of the source page, and the destination page redundancy assignment replaces the set of defective positions in a main array part of the destination page with particular parts of the redundant memory of the destination page.

22. The method of claim 17, wherein
wherein the page copy operation performs:
copying the source page into a page buffer of the memory array and temporary registers of the page buffer, such that a main array part of the source page is copied to a main page buffer of the page buffer, and a redundant array part of the source page is copied to a redundant page buffer of the page buffer and the temporary registers; and then
transferring data from at least one particular redundant address of the temporary registers to at least one particular main address of the main page buffer, wherein a source page redundancy assignment repaired the at least one particular main address of the main array part of the source page with the at least one particular redundant address of the redundant array part of the source page.

23. The method of claim 17,
wherein the page copy operation performs:
copying the source page into a page buffer of the memory array and temporary registers of the page buffer, such that a main array part of the source page is copied to a main page buffer of the page buffer, and a redundant array part of the source page is copied to a redundant page buffer of the page buffer and the temporary registers; and then
transferring data from at least one particular main address of the main page buffer to at least one particular redundant address of the redundant page buffer, wherein a destination page redundancy assignment repaired the at least one particular main address of the main array part of the destination page with the at least one particular redundant address of the redundant array part of the destination page.

24. The method of claim 17,
wherein the page copy operation transfers data from a part of the source page in the main array to a part of the destination page in the redundant array.

25. The method of claim 17, further comprising:
responsive to said replacing, redirecting memory operations that address the set of defective positions in the particular segment of the main array, to the redundant memory in the corresponding particular segment of the redundant array.

* * * * *

UNITED STATES PATENT AND TRADEMARK OFFICE
CERTIFICATE OF CORRECTION

| | | |
|---|---|---|
| PATENT NO. | : 8,976,604 B2 | Page 1 of 1 |
| APPLICATION NO. | : 13/372193 | |
| DATED | : March 10, 2015 | |
| INVENTOR(S) | : Shuo-Nan Hung | |

It is certified that error appears in the above-identified patent and that said Letters Patent is hereby corrected as shown below:

IN THE CLAIMS

In claim 17, column 18, line 25, delete the word "pa e" and insert the word -- page --.

In claim 19, column 18, line 44, delete the words "of transferring" and insert the words -- of: transferring --.

Signed and Sealed this
Nineteenth Day of January, 2016

Michelle K. Lee
*Director of the United States Patent and Trademark Office*